April 30, 1963 C. D. BRUBAKER 3,087,684

WIRE-WRAPPING APPARATUS

Filed April 17, 1961

INVENTOR

C. D. BRUBAKER

BY Don P. Bush

ATTORNEY 3,087,684
Patented Apr. 30, 1963

3,087,684

WIRE-WRAPPING APPARATUS

Chadwick D. Brubaker, Columbus, Ohio, assignor to Western Electric Company, Incorporated, a corporation of New York Filed Apr. 17, 1961, Ser. No. 103,545
3 Claims. (Cl. 242—7)

This invention relates to wire-wrapping apparatus for effecting wrapped-wire or solderless connections by wrapping the leading ends of wire leads of electrical components on terminals or binding posts. The invention relates more specifically, although not exclusively, to certain structural features of wire-wrapping apparatus for providing predetermined, variable spacing between the axis and the free ends of terminal posts with respect to the bodies of electrical components which are mounted solely by wrapping wire leads projecting from the ends of the components around the terminal posts.

When mounting electrical components between rows of terminals of a terminal strip by wrapping lead wires projecting from opposite ends of the electrical components around associated terminals in a spaced pair of rows of terminals, the spacing of the electrical components with respect to the associated pairs of spaced terminals are usually nonuniform. Care must be taken to insure that each lead is wrapped around its associated terminal or binding post a sufficient number of times to make a strong joint and a good electrical connection.

If an excessive length of one lead is wrapped around one of the terminals, an insufficient length of the other lead will remain to be wrapped on the terminal adjacent to the opposite end of the component unless both of the leads projecting from the opposite ends of the electrical components are extra long. Further, it is obvious that the component will not be spaced symmetrically between the terminals. This is undesirable from an aesthetic standpoint; and the electrical properties may be adversely affected because of the effect of mutual inductance and mutual capacitance, particularly if the components are to be used in relatively high frequency circuits such as those used in radar or microwave systems. It is, therefore, desirable that all of the components be positioned substantially symmetrically with respect to rows of terminals on opposite sides of the electrical components, particularly those containing coils or condensers.

An object of the present invention is to provide new and improved apparatus for making wrapped-wire connections, particularly apparatus for wrapping wire leads of electrical components to terminals or binding posts.

Another object of this invention is to provide new and improved apparatus for facilitating the mounting of electrical components by merely wrapping wire leads projecting from opposite ends of the electrical components onto spaced pairs of the terminals.

A further object of the present invention is to provide apparatus for wrapping the leads of electrical components uniformly on terminals or binding posts to improve the electrical and aesthetic properties of electrical apparatus produced in this manner.

A still further object of the present invention is to provide apparatus for winding or wrapping a predetermined length of a wire lead on a terminal to effect an electrical connection therebetween without requiring the soldering of the joint for efficient electrical conductivity between the wire lead and the terminal while spacing an electrical component, from which the lead projects, a predetermined distance from the terminal to permit subsequent soldering of the wrapped joint to provide a better electrical connection between the component and the terminal.

Apparatus embodying certain features of the present invention may be used for wrapping the end of a wire lead around a terminal post to form a wrapped electrical connection between the terminal post and an electrical component from which the wire lead projects and for spacing the adjacent end of the electrical component a predetermined distance from the axis of the terminal post. The apparatus may include a rotatable spindle provided with an axial recess in a free end thereof for receiving the terminal post and having formed therein an eccentrically positioned channel for receiving the end portion of the wire lead projecting from the electrical component. A relatively stationary spacer member is mounted on the side of the apparatus and has a slot therein adapted for receiving a portion of the wire lead bent at substantially a right angle and extending laterally of the spindle. The stationary spacer member has an abutment surface against which the adjacent end of the electrical component is urged during a wrapping operation to insure a desired predetermined spacing between the axis of the terminal post and the adjacent end of the component. The spacer member controls the length of the portion of the lead wrapped around the terminal post and controls the electrical and aesthetic properties of a product produced by the use of the tool.

Other objects and advantages of the invention will be more readily understood from the following detailed description of apparatus forming specific embodiments thereof, when read in conjunction with the appended drawings, in which.

Figures 1, 2:
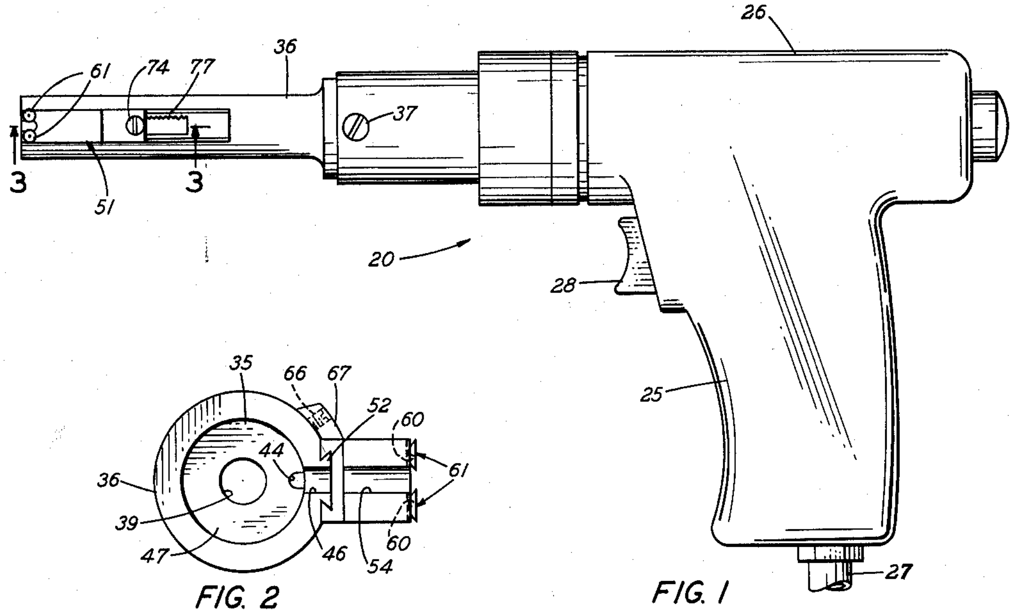
FIG. 1 is a side elevational view of a wire-wrapping apparatus forming one embodiment of the invention.
FIG. 2 is an enlarged end view of the apparatus of FIG. 1.
Figure 3:
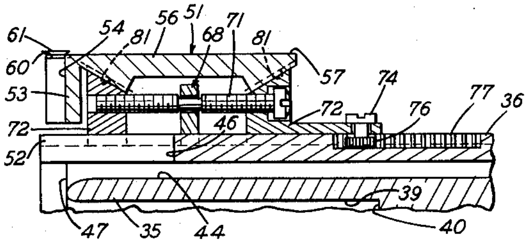
FIG. 3 is an enlarged, fragmentary, sectional view of the apparatus of FIG. 1, taken on line 3—3 thereof.
Figure 4:
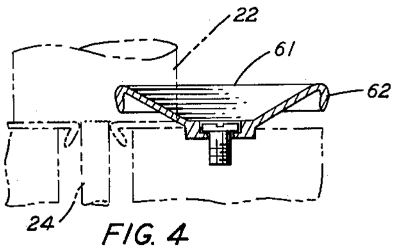
FIG. 4 is an enlarged, fragmentary, sectional view of clamping elements of the apparatus of FIG. 1.
Figure 5:
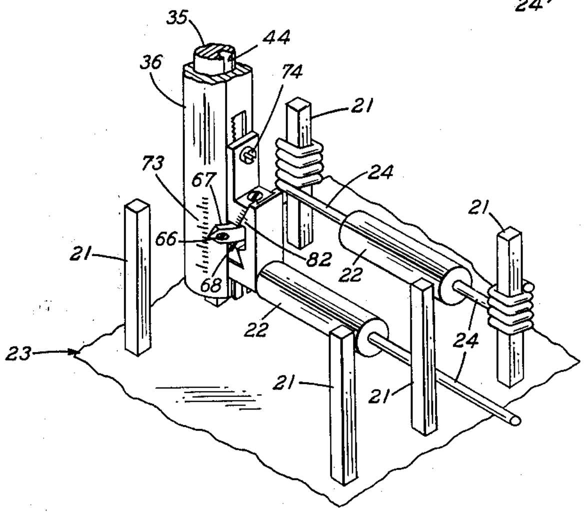
FIG. 5 is an enlarged, fragmentary view of a portion of the apparatus of FIG. 1 illustrated in a winding position on a terminal strip on which the apparatus is utilized to mount electrical components between spaced terminals of the terminal strip.

Referring now to the drawings, a wire-wrapping apparatus, designated generally by the numeral 20, forming an exemplary embodiment of the invention is illustrated in FIG. 1. A fragmentary portion of the wire-wrapping apparatus 20 is shown in FIG. 5 in an operating position relative to one of a plurality of terminals or binding posts 21—21 of a pair of spaced rows of terminals of a terminal strip 23 of a high frequency electrical apparatus. A plurality of electrical components 22—22 are to be mounted between the rows of terminals 21—21 by merely wrapping electrical leads 24—24 projecting from opposite ends of the components spirally, in a tight helix, around associated pairs of terminals in the rows of terminals.

The wire-wrapping apparatus 20 includes a pistol-grip handle portion 25 at the upper end of which is formed a housing 26 enclosing an air motor (not shown). The air motor is driven rotatably by compressed air supplied through a line 27 under the control of a trigger valve 28. The air motor is rotated unidirectionally in response to the actuation of the trigger valve 28 to rotate a wrapping element or spindle 35 which is connected operatively to the motor for rotation therewith. The spindle 35 is mounted rotatably in a stationary sleeve 36 which is secured detachably and adjustably to the housing 26 by a set screw 37.

The forward end of the spindle 36 is provided with a central cylindrical bore 39 forming an axial recess in the end thereof for receiving end portions of the terminals or binding posts 21—21 onto which wire leads 24—24 are to be wound. The closed end 40 of the bore 39 forms a stop for limiting the inward movement of the terminals 21—21 and serves to locate the ends of the terminals 21—21 in a predetermined position with respect to the end of the spindle 35. An eccentrically disposed, longitudinally extending recess or channel 44 is formed in the spindle 35 in spaced, parallel relationship to the bore 39 for receiving the end portions of the wire leads 24—24 individually therein. The recess 44 may be drilled into the spindle 35 but is preferably formed as a milled groove in the periphery thereof, which groove is closed on the side by the stationary sleeve 36.

A predetermined length of the wire lead 24 is adapted to be inserted into the recess 44 and the portion of the lead 24 projecting outwardly therefrom is bent transversely of the spindle 35 and is supported in a slot 46 in the end portion of the stationary sleeve 36 which extends beyond the end of the spindle 35. The forward end of the recess 44 is rounded and merges with a flat end murface 47 disposed perpendicular to the axis of the spindle 35.

A notched, spacer block, designated generally by the numeral 51, is secured adjustably to a dove-tailed projection 52 on the outer periphery of the sleeve 36. The spacer block 51 is provided with a depending portion 53 having a notch 54 therein in alignment with the slot 46 in the sleeve 36 to permit the portion of the wire lead 24 which is bent transversely of the spindle 35 and positioned in the slot 46 to extend through the notch 54. In this way the electrical component 22 and the adjacent portion of the lead 24 is held relatively stationary with respect to the spindle 35 during a lead-wrapping operation to cause the free end of the wire lead 24 to be wrapped spirally around the terminal 21 in a relatively tight helix.

The notched spacer block 51 is provided with an adjustable element 56 formed integrally with the depending portion 53 and having an abutment surface 57 against which the adjacent end of the electrical components 22—22, from which the associated wire leads 24—24 project, are urged during wrapping operations to insure that the ends of the components 22—22 are positioned desired predetermined distances from the axes of the terminals 21—21. A pair of modified, circular "Belleville" springs 61—61, having retroflexed lead-engaging edges 62—62, are mounted rotatably in depressions 60—60 in the abutment surface 57 of the spacer block 51 on opposite sides of the notch 54 to permit insertion of the leads 24—24 between the springs 61—61 which act as clamps. When the end of the electrical component 22 engages the springs 61—61, the adjacent edge portions 62—62 of the springs 61—61 clamp the portion of the lead 24 positioned therebetween and prevent the lead 24 from being pulled from the associated component 22.

The portion of the spacer block 51 against which the component is urged during a lead-wrapping operation is mounted adjustably on the sleeve 36 to permit longitudinal and transverse movement of the abutment surface 57 of the block with respect to the sleeve to facilitate varying the distances that the adjacent ends of the electrical components 22—22 are positioned from the axes of the terminals 21—21 and to vary the relative position of the axes of the components 22—22 with respect to the upper ends of the terminals 21—21. In this manner the adjustable spacer block 51 can be utilized for standardizing the dress of the components 22—22 and terminals 21—21 to control the lengths of the portion of the leads 24—24 wrapped around each of the terminals 21—21 and to improve the aesthetic and electrical properties of the finished electrical apparatus.

The entire spacer block 51 is secured in position on the sleeve 36 by a set screw 66 in a projection 67 of a member, designated generally by the numeral 68. The member 68 is secured fixedly in a reduced intermediate portion of a screw 71 interconnecting a pair of opposed wedges 72—72 mounted slidably on the dove-tailed projection 52 on the sleeve 36. Thes crew 71 has opposite hand threads on opposite ends thereof. The entire block 51 is moved adjustably on the dove-tailed projection 52 longitudinally of the sleeve 36 along a calibrated scale 73, which indicates the distance between the bottom 40 of the recess 39 and the lead-engaging surface formed by the notch 54 in the block 51. The block 51 is moved by loosening the set screw 66, turning a screw head 74, formed integrally with a freely rotatable gear 76 engaging a gear rack 77 which, in turn is formed integrally with the sleeve 36, and thus moving the gear 76 and attached spacer block 51 along this rack 77.

The outer component-engaging portion 56 of the spacer block 51 is adjustable transversely of the axis of the bore 39 or terminal 21, positioned therein, by securing the screw 71 in place by the set screw 66 in the member 68 and rotating the screw 71, which has opposite hand threads on opposite ends thereof. The opposite ends of the screw are secured threadedly in the opposed wedges 72—72 of the block 51 and move the wedges 72—72 along dove-tailed slots 81—81 in the outer portion 56 of the block 51 along a calibrated scale 82 for controlling the distance the ends of the components 22—22 are spaced from the axes of associated terminals 21—21.

*Operation*

In operation, the apparatus 20 is used to mount electrical components 22—22 between spaced terminals 21—21 and to form solderless electrical connections between the terminals 21—21 and leads 24—24 projecting from opposite ends of the components 22—22 by wrapping the ends of the leads 24—24 around the terminals 21—21 while maintaining the ends of the components 22—22 predetermined distances from the axes of the terminals 21—21. In order to accomplish this purpose, the end portion of a wire lead 24 is inserted in the eccentric wire-receiving recess or channel 44 in the spindle 35. The wire lead 24 at the end of the groove 44 is bent transversely and is positioned in the slot 46 in the sleeve 36, between the clamping springs 61—61 and into the notch 54 in the depending portion 53 of the block 51 where the component 22 and lead 24 may be held by the left hand of the operator.

The wrapping apparatus or tool 20 is moved with the wire lead 24 therein relative to the stationary terminal 21 to cause the insertion of the end of the terminal 21 into the bore 39 of the spindle 35. With the spindle 35 of the apparatus 20 positioned properly relative to the terminal 21, as illustrated in FIG. 5, the trigger valve 28 is actuated to cause the rotation of the spindle 35 to effect the wrapping of successive portions of the wire lead 24 tightly around the terminal 21 and pull the adjacent end of the electrical component 22 toward the abutment surface 57 of the spacer block 51. When the electrical component 22 is urged against the abutment surface 57 of the spacer block 51, the component 22 is urged against the clamping springs 61—61 to clamp the lead 24 therebetween and insure that the lead 24 is not pulled from the end of the component 22 by the wrapping spindle 35.

During the rotation of the spindle 35, as successive convolutions of the wire lead 24 are wound onto the terminal 21, there is axial movement of the spindle 35 relative to the terminal 21 whereby the terminal 21 is progressively pushed outwardly relative to the bore 39 in response to the pressure of successive portions of the wire lead 24 against the end of the spindle 35 as the wire lead 24 emerges from the groove 44. After the end of the wire lead 24 had been withdrawn from the groove 44 and wrapped tightly around the terminal 21, the rotation of the spindle 35 may be stopped, but, in practice, the rotation of the spindle 35 continues for several revolutions before the spindle 35 stops. After the spindle 35 stops rotating, the apparatus 20 is removed from the terminal 21. When the sleeve 36 is retracted around the terminal 21, the block 51 is pulled away from the lead 24. This action causes the clamping springs 61—61 to rotate to release the lead 24 from the clamping springs 61—61.

*Alternative Embodiments*

Figure 6:
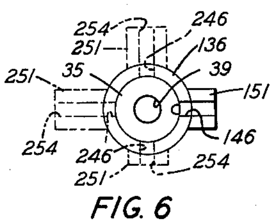
FIG. 6 is an end view of an alternative embodiment of the apparatus of FIG. 1.

Referring now to FIG. 6, it should be understood that a plurality of sleeves 136, each having an integrally formed, notched spacer block 151 of a different length than the other, similar to the one illustrated in solid lines in FIG. 6 of the drawings, could be utilized selectively to provide selective spacings between the ends of electrical components 22—22 and the axes of the terminals 21—21.

In the alternative, a plurality of notched spacer blocks 251—251 of varying lengths, as illustrated in phantom lines in FIG. 6, could be spaced around the outer periphery of the stationary sleeve 136 with notches 254—254 in the spacer blocks 251—251 being aligned with slots 246—246 in the sleeve 136 or the sleeve could be rotated with respect to a single slot 146 in the sleeve 136 by loosening the set screw 37. In this way, the same sleeve 136 can be used to effect positioning of electrical components 22—22 various distances from the axes of terminals 21—21 without having to provide an adjustable spacer block similar to the spacer block 51 of the preferred embodiment or having to provide separate sleeves 136 having abutment surfaces of the spacer blocks 151—151 positioned various distances from the axis of the recess 39 in the center of the spindle 35.

The operation of the alternative embodiments should be obvious by referring to the description of the operation of the preferred embodiment of the apparatus.

It is to be understood that the above-described arrangements are simply illustrative of the principles of the invention. Other arrangements may be devised by those skilled in the art which will embody the principles of the invention and fall within the spirit and scope thereof.

What is claimed is:

1. A wire-wrapping tool for wrapping the end of a wire lead around a terminal post to form a wrapped electrical connection between the terminal post and an electrical component from which the wire lead projects and for spacing the adjacent end of the electrical component a predetermined distance from the axis of the terminal post, which comprises a housing, a motor mounted in the housing, a slotted sleeve secured to the housing, a wrapping spindle mounted rotatably in the housing and extending into the sleeve, a notched spacer member secured to the periphery of the sleeve with the notch therein aligned with the slot in the sleeve, the spacer member projecting outwardly from the sleeve and having a peripheral abutment surface positioned a predetermined distance from the axis of the wrapping spindle against which a portion of the electrical component from which the lead projects is urged during a wrapping operation to control the distance between the end of the component and the axis of the terminal post, resilient clamping means secured to the spacer member and urged into clamping engagement with the wire lead by the adjacent end of the electrical component, and means for controlling the operation of the motor for effecting a wrapping operation.

2. A wire-wrapping tool for wrapping the end of a wire lead around a terminal post to form a wrapped electrical connection between the terminal post and an electrical component from which the wire lead projects and for spacing the adjacent end of the electrical component a predetermined distance from the axis of the terminal post, which comprises a housing, a motor mounted in the housing, a slotted sleeve secured to the housing, a wrapping spindle mounted rotatably in the housing and extending into the sleeve, a notched spacer member secured adjustably to the periphery of the sleeve with the notch therein aligned with the slot in the sleeve, the spacer member projecting outwardly from the sleeve and having a peripheral abutment surface positioned a predetermined variable distance from the axis of the wrapping spindle against which a portion of the electrical component from which the lead projects is urged during a wrapping operation to control the distance between the end of the component and the axis of the terminal post, means for varying the longitudinal position of the notch in the spaced member and the distance between the abutment surface and the axis of the terminal, and means for controlling the operation of the motor for effecting a wrapping operation.

3. Wire-wrapping apparatus used for mounting electrical components between terminals by means of leads projecting from the electrical components, which comprises a rotatable spindle having an axially disposed recess therein designed for receiving an end portion of a terminal therein and having an eccentrically disposed recess extending substantially longitudinally of the spindle designed for receiving an end portion of an electrical lead projecting from an electrical component to be secured electrically and mechanically to the terminal, a relatively stationary member having an adjustable spacer member projecting transversely of the axis of the spindle designed for engaging the portion of the electrical component from which the associated lead projects to maintain a desired predetermined variable spacing between the end of the electrical component and the axis of the terminal, and means for rotating the spindle to wrap the lead positioned in the eccentric recess about the terminal received in the axial recess in the spindle whereby the adjacent end of the electrical component is held against the spacer member to insure a predetermined variable spacing between the end of the component and the axis of the terminal thus standardizing the dress of the components and terminals, controlling the length of the portion of the lead wrapped around the terminal and improving the appearance and electrical properties of the finished product.

References Cited in the file of this patent

UNITED STATES PATENTS

| | | |
|---|---|---|
| 2,648,356 | Beaulieu et al. | Aug. 11, 1953 |
| 2,955,769 | Boswell et al. | Oct. 11, 1960 |